US012775571B2

(12) United States Patent
Jin et al.

(10) Patent No.: US 12,775,571 B2
(45) Date of Patent: Oct. 27, 2026

(54) CHIPLET HAVING SAVE AND FORWARD MODULE

(71) Applicant: REBELLIONS INC., Seongnam-si (KR)

(72) Inventors: Young-Jae Jin, Seongnam-si (KR); Miock Chi, Seongnam-si (KR); Chang-Hyo Yu, Seongnam-si (KR)

(73) Assignee: REBELLIONS INC., Seongnam-si (KR)

(*) Notice: Subject to any disclaimer, the term of this patent is extended or adjusted under 35 U.S.C. 154(b) by 0 days.

(21) Appl. No.: 18/939,165

(22) Filed: Nov. 6, 2024

(65) Prior Publication Data

US 2025/0181538 A1 Jun. 5, 2025

(30) Foreign Application Priority Data

Dec. 4, 2023 (KR) ........................ 10-2023-0173828
Apr. 26, 2024 (KR) ........................ 10-2024-0056363

(51) Int. Cl.
*G06F 13/40* (2006.01)
*G06F 11/30* (2006.01)
(Continued)

(52) U.S. Cl.
CPC ...... *G06F 13/4068* (2013.01); *G06F 11/3006* (2013.01); *G06F 11/3051* (2013.01); *G06F 11/348* (2013.01); *G06F 13/14* (2013.01); *G06F 13/1673* (2013.01); *G06F 13/28* (2013.01); *G06F 13/36* (2013.01); *G06F 13/4031* (2013.01); *G06F 13/409* (2013.01); *H10W 70/611* (2026.01); *H10W 70/641* (2026.01); *H10W 90/00* (2026.01); *H10W 90/401* (2026.01); *G06F 2213/0026* (2013.01); *G06F 2213/40* (2013.01)

(58) Field of Classification Search
None
See application file for complete search history.

(56) References Cited

U.S. PATENT DOCUMENTS 9,286,258 B2 * 3/2016 Gardiner ............. G06F 13/4282
9,804,988 B1 * 10/2017 Ayoub ............... G06F 13/4022
(Continued)

FOREIGN PATENT DOCUMENTS

KR 10-2004-0100724 A 12/2004
KR 10-2012-0040533 A 4/2012
KR 10-2013-0071782 A 7/2013

*Primary Examiner* — Henry Tsai
*Assistant Examiner* — Christopher A Bartels
(74) *Attorney, Agent, or Firm* — BROADVIEW IP LAW, PC

(57) ABSTRACT

Provided is a chiplet including an interconnect module for connecting to another chiplet, a bus interface for connecting to at least one functional module in the chiplet, and a save and forward module connected to the interconnect module and the bus interface, in which the save and forward module includes a slave port that receives a transaction from one of the interconnect module or the bus interface, a data buffer that temporarily stores at least a portion of the transaction, and a master port that transmits the transaction stored in the data buffer to the other one of the interconnect module or the bus interface, and the transaction is divided into predetermined units and transmitted.

19 Claims, 9 Drawing Sheets

(51) Int. Cl.

| | |
|---|---|
| ***G06F 11/34*** | (2006.01) |
| ***G06F 13/14*** | (2006.01) |
| ***G06F 13/16*** | (2006.01) |
| ***G06F 13/28*** | (2006.01) |
| ***G06F 13/36*** | (2006.01) |
| ***H10W 70/60*** | (2026.01) |
| ***H10W 70/62*** | (2026.01) |
| ***H10W 90/00*** | (2026.01) |

(56) References Cited

U.S. PATENT DOCUMENTS

| | | | | |
|---|---|---|---|---|
| 10,381,067 | B2 | 8/2019 | Shaeffer et al. | |
| 10,509,751 | B2 * | 12/2019 | Yamashita | G06F 13/36 |
| 11,388,103 | B2 | 7/2022 | Shi et al. | |
| 11,487,685 | B2 * | 11/2022 | Kee | G06F 13/1668 |
| 2012/0131246 | A1 | 5/2012 | Jeong et al. | |
| 2013/0166801 | A1 | 6/2013 | Chun et al. | |
| 2014/0025853 | A1 | 1/2014 | Fujita et al. | |
| 2015/0106778 | A1 * | 4/2015 | Mangano | G06F 13/4068 716/130 |
| 2017/0228252 | A1 * | 8/2017 | Gadelrab | G06F 16/1744 |
| 2021/0288910 | A1 * | 9/2021 | Daly | H04L 47/24 |
| 2022/0045940 | A1 * | 2/2022 | Subrahmanya | G06F 16/907 |
| 2022/0045945 | A1 * | 2/2022 | Subrahmanya | H04L 45/38 |
| 2022/0245072 | A1 * | 8/2022 | Roweth | H04L 47/32 |
| 2023/0042222 | A1 | 2/2023 | Brewer | |
| 2023/0114271 | A1 * | 4/2023 | Pappu | G06F 11/1004 710/113 |
| 2023/0114371 | A1 * | 4/2023 | Lopez Duarte | G10H 1/0025 463/35 |
| 2023/0291688 | A1 | 9/2023 | Pan et al. | |
| 2023/0385222 | A1 * | 11/2023 | Ma | G06F 13/4068 |
| 2024/0394216 | A1 * | 11/2024 | Ansari | G06F 15/7821 |
| 2025/0123990 | A1 * | 4/2025 | Das Sharma | G06F 12/0828 |
| 2025/0139040 | A1 * | 5/2025 | Jain | G06F 13/4004 |
| 2025/0181538 | A1 * | 6/2025 | Jin | G06F 11/0757 |
| 2026/0059666 | A1 * | 2/2026 | Park | H05K 1/141 |
| 2026/0111388 | A1 * | 4/2026 | Sinha | G06F 13/4282 |

* cited by examiner

| 710 | 720 | 730 | 740 | 750 | 760 |
|---|---|---|---|---|---|
| Validity | ID | Transmission start time | Transmission end time | Error occurrence time | Error flag |
| | | | | | |
| | | | | | |
| | | | | | |

700

FIG. 7

CHIPLET HAVING SAVE AND FORWARD MODULE

CROSS-REFERENCE TO RELATED APPLICATIONS

The present application claims priority to Korean Application No. 10-2023-0173828, filed on Dec. 4, 2023, in the Korean Intellectual Property Office, and Korean Application No. 10-2024-0056363, filed on Apr. 26, 2024, in the Korean Intellectual Property Office, the entire disclosure of which is incorporated by reference herein.

TECHNICAL FIELD

The present disclosure relates to a chiplet including a save and forward module.

BACKGROUND

The demand for high performance and miniaturization of semiconductor devices and electronic products using the same has increased, leading to the development of various packaging technologies related to the semiconductor devices. Along with the development of these technologies, packaging technologies using chiplets are gaining attention.

Chiplet system may refer to a system that is provided by, rather than configuring chips performing various functions on one die (or substrate), dividing the chips in units of functionalities, configuring the divided chips on each of a plurality of dies (chiplet), and packaging them into one system. That is, the chiplet system was developed to overcome the limitations of existing monolithic chips, and since the chiplets can be miniaturized in units of functionalities, it is possible to overcome the size limitation of reticles, that is, the templates that print circuits on wafer surfaces using light in the photo process of semiconductors. In addition, since the yield of semiconductor manufacturing tends to be inversely proportional to the area, using the chiplets can increase the yield of semiconductor manufacturing and also reduce manufacturing costs. Accordingly, in recent years, there is an increasing demand for using the chiplet when manufacturing electronic products.

Meanwhile, in the related chiplet system, if an abnormality occurs during communication between a plurality of dies (chiplets), there is a problem of unnecessary occupation of the bus system and ports and cascading delays in the communication. Accordingly, there is a growing need for a method that can minimize the corresponding delays in the design of the chiplet system.

SUMMARY

In order to solve one or more problems (e.g., the problems described above and/or other problems not explicitly described herein), the present disclosure provides an electronic device including a plurality of chiplets.

The present disclosure may be implemented in a variety of ways, including methods, devices (systems) and/or computer programs stored in computer readable storage media.

The chiplet may include an interconnect module for connecting to another chiplet, a bus interface for connecting to at least one functional module in the chiplet, and a save and forward module connected to the interconnect module and the bus interface, and the save and forward module may include a slave port that receives a transaction from one of the interconnect module or the bus interface, a data buffer that temporarily stores at least a portion of the transaction, and a master port that transmits the transaction stored in the data buffer to the other one of the interconnect module or the bus interface, and the transaction may be divided into predetermined units and transmitted.

In response to determining that entire transaction is stored in the data buffer, the master port may transmit the entire transaction.

The transaction may be a burst transaction transmitted with a burst transfer method, the burst transaction may include a plurality of beats, and the predetermined unit may be a beat unit.

The chiplet may be a receiver side chiplet that receives the transaction from the other chiplet, the slave port may receive the transaction from the interconnect module, and the master port may transmit the transaction to the bus interface.

The bus interface may be an Advanced extensible Interface (AXI) type interface.

The save and forward module may further include a transaction decoder that receives the plurality of beats from the slave port, and a transaction counter that receives information associated with each beat received from the transaction decoder.

The transaction counter may determine whether all of the plurality of beats are received in the data buffer, and in response to determining that all of the plurality of beats are received in the data buffer, cause the master port to transmit all of the plurality of beats stored in the data buffer.

The transaction decoder may determine that the transaction is a burst transaction, based on control information included in a first beat received from the slave port.

In response to determining that the transaction is the burst transaction, the transaction decoder may store the beats received from the slave port in the data buffer.

The transaction counter may generate a first error signal based on the control information and a data size of the transaction.

The save and forward module may further include an interrupt handler, and the interrupt handler may receive the first error signal from the transaction counter, generate a first interrupt based on the first error signal, and transmit the first interrupt to a host.

The save and forward module may further include a transaction time table register that manages a transaction time table associated with the transaction.

The transaction time table may include at least one of a validity of the transaction, an ID of the transaction, a transmission start time, a transmission end time, an error occurrence time, or an error flag.

The save and forward module may further include a timer, and the transaction time table register may record at least one of a transmission start time, a transmission end time, or an error occurrence time of the transaction in the transaction time table using the timer.

The save and forward module may further include a comparator that generates a second error signal associated with a transmission time of the transaction, and in response to determining that a predetermined error time threshold has been exceeded since the transmission start time of the transaction recorded in a time table of the transaction, the comparator may generate the second error signal.

The save and forward module may further include an interrupt handler, and the interrupt handler may receive the second error signal from the comparator, generate a second interrupt based on the second error signal, and transmit the second interrupt to a host.

While some of the plurality of beats are stored in the data buffer, access to the slave port and/or the interconnect module by the at least one functional module may be allowed.

The chiplet may be a transmitter side chiplet that transmits the transaction to the other chiplet, the slave port may receive the transaction from the bus interface, and the master port may transmit the transaction to the interconnect module.

The slave port may transmit to the data buffer whenever the slave port receives a plurality of beats included in the transaction in units of beats, the data buffer may sequentially store the received beats, and before all of the plurality of beats are stored in the data buffer, transmission of at least one beat stored in the buffer may not be performed.

A size of the data buffer may be determined based on a data size of the transaction.

According to various aspects of the present disclosure, at least a portion of the received transaction may be stored using the data buffer of the save and forward module included in the chiplet. As a result, a problem of unnecessary occupation of the resources due to communication abnormality may be prevented.

According to various aspects of the present disclosure, the save and forward module can recognize and generate an interrupt when a portion of the transaction is lost or the transaction transmission time is delayed during the transaction transfer process. As a result, problems that may occur during a communication process between chiplets can be clearly detected.

According to various aspects of the present disclosure, portions of the transaction received in the data buffer of the save and forward module included in the chiplet can be sequentially stored, and the entire stored transaction can be transmitted to the interconnect module or the bus interface. As a result, a time bubble that may occur when the received transaction is directly transmitted can be removed, and the resource occupancy time of the chiplet receiving the transaction can be minimized.

The effects of the present disclosure are not limited to the effects described above, and other effects not described herein can be clearly understood by those of ordinary skill in the art (referred to as "ordinary technician") from the description of the claims.

BRIEF DESCRIPTION OF THE DRAWINGS

The above and other objects, features and advantages of the present disclosure will be described with reference to the accompanying drawings described below, where similar reference numerals indicate similar elements, but not limited thereto, in which:

FIG. 7 is a diagram illustrating an example of a transaction time table;

DETAILED DESCRIPTION

Figure 1:
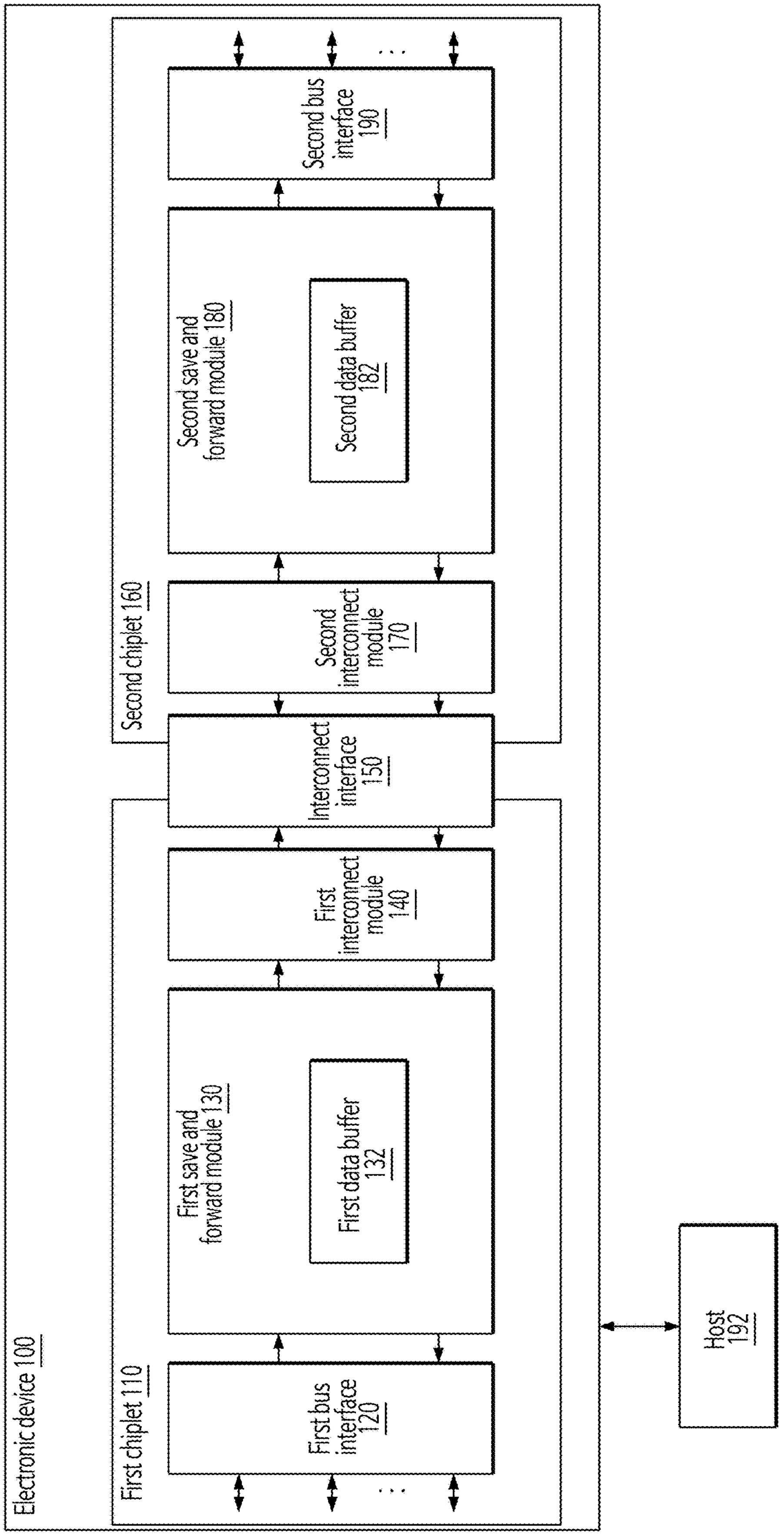
FIG. 1 is a diagram provided to explain a configuration of an electronic device including a plurality of chiplets.

Hereinafter, example details for the practice of the present disclosure will be described in detail with reference to the accompanying drawings. However, in the following description, detailed descriptions of well-known functions or configurations will be omitted if it may make the subject matter of the present disclosure rather unclear.

In the accompanying drawings, the same reference numerals are assigned to the same or corresponding components. In addition, in the description of the following aspects, overlapping descriptions of the same or corresponding components may be omitted. However, even if the description of the component is omitted, it is not intended that such a component is not included in any aspect.

Advantages and features of the disclosed examples and methods of accomplishing the same will be apparent by referring to examples described below in connection with the accompanying drawings. However, the present disclosure is not limited to the examples disclosed below, and may be implemented in various forms different from each other, and the examples are merely provided to make the present disclosure complete, and to fully disclose the scope of the disclosure to those skilled in the art to which the present disclosure pertains.

The terms used herein will be briefly described prior to describing the disclosed example(s) in detail. The terms used herein have been selected as general terms which are widely used at present in consideration of the functions of the present disclosure, and this may be altered according to the intent of an operator skilled in the art, related practice, or introduction of new technology. In addition, in specific cases, certain terms may be arbitrarily selected by the applicant, and the meaning of the terms will be described in detail in a corresponding description of the example(s). Therefore, the terms used in the present disclosure should be defined based on the meaning of the terms and the overall content of the present disclosure rather than a simple name of each of the terms.

The singular forms "a," "an," and "the" as used herein are intended to include the plural forms as well, unless the context clearly indicates the singular forms. Further, the plural forms are intended to include the singular forms as well, unless the context clearly indicates the plural forms. Throughout the description, when a portion is stated as "comprising (including)" an element, unless specified to the contrary, it intends to mean that the portion may additionally include another element, rather than excluding the same.

In addition, the term "module" or "unit" used in the specification refers to a software or hardware component, and the "module" or "unit" performs certain roles. However, the meaning of the "module" or "unit" is not limited to software or hardware. The "module" or "unit" may be configured to be in an addressable storage medium or configured to play one or more processors. Thus, as an example, the "module" or "unit" may include components such as software components, object-oriented software components, class components, and task components, and at least one of processes, functions, attributes, procedures, subroutines, segments of program code, drivers, firmware, microcode, circuitry, data, database, data structures, tables, arrays, or variables. Components and "modules" or "units" may be combined into a smaller number of components and "modules" or "units" or further separated into additional components and "modules" or "units".

The "module" or "unit" may be implemented as a processor and a memory. The "processor" should be interpreted broadly to encompass a general-purpose processor, a Central Processing Unit (CPU), a microprocessor, a Digital Signal Processor (DSP), a controller, a microcontroller, a state machine, and so forth. Under some circumstances, the "processor" may refer to an application-specific integrated circuit (ASIC), a programmable logic device (PLD), a field-programmable gate array (FPGA), etc. The "processor" may refer to a combination for processing devices, e.g., a combination of a DSP and a microprocessor, a combination of a plurality of microprocessors, a combination of one or more microprocessors in conjunction with a DSP core, or any other combination of such configurations. In addition, the "memory" should be interpreted broadly to encompass any electronic component that is capable of storing electronic information. The "memory" may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or marking data storage, registers, etc. The memory is said to be in electronic communication with a processor if the processor can read information from and/or write information to the memory. The memory integrated with the processor is in electronic communication with the processor.

In addition, terms such as first, second, A, B, (a), (b), etc. used in the following examples are only used to distinguish certain components from other components, and the nature, sequence, order, etc. of the corresponding components are not limited by the terms.

In addition, in the following aspects, if one component is described to be "connected", "coupled", or "attached" to another component, it should be understood that the one component may be directly connected or attached to another component, or yet another component may be "connected", "coupled", or "attached" between each of the components.

In addition, the words "comprises" and/or "comprising" as used herein means that the components, steps, operations, and/or elements mentioned do not exclude the presence or addition of one or more other components, steps, operations, and/or elements.

In addition, in the following examples, "each of a plurality of A's" may refer to each of all components included in the plurality of A's, or may refer to each of some of the components included in the plurality of A's.

In the present disclosure, a "chiplet" is an integrated circuit (IC) block and may be a type of semiconductor device that is coupled, connected, and combined with another chiplet to configure one package. The dies in the chiplet system may be connected to each other through a silicon interposer and communicate with each other according to a die-to-die communication standard such as Universal Chiplet Interconnect Express (UCIe).

In the present disclosure, a "source node" may refer to a chiplet or a part of a chiplet where the transfer of specific information or data (e.g., transaction) starts.

In the present disclosure, a "relay node" may refer to a chiplet or a part of a chiplet that receives information or data from a source node or other relay node and transmits the information to another relay node or a destination node, and a "destination node" may refer to a chiplet or a part of a chiplet that receives information or data from a source node or relay node and processes the same.

In the present disclosure, the term "time bubble" may refer to an idle time generated during a transaction transfer process. The "time bubble" may be caused by retransmission due to transaction loss, inefficient encoding/decoding of a flit of a transaction, etc. In addition, the "time bubble" may increase as the number of relay nodes through which transactions pass increases.

Hereinafter, various aspects of the present disclosure will be described in detail with reference to the accompanying drawings.

FIG. 1 is a diagram provided to explain a configuration of an electronic device 100 including a plurality of chiplets 110 and 160. The electronic device 100 may include a first chiplet 110 and a second chiplet 160, and may be connected to a host 192. Although the first chiplet 110 and the second chiplet 160 are illustrated in FIG. 1 for convenience of description, aspects are not limited thereto, and the electronic device 100 may include any number of chiplets.

As illustrated, the first chiplet 110 may include a first bus interface 120, a first save and forward module 130, and a first interconnect module 140. The second chiplet 160 may include a second interconnect module 170, a second save and forward module 180, and a second bus interface 190. The first chiplet 110 and the second chiplet 160 may transmit and receive information and data to and from each other through the interconnect modules 140 and 170 and an interconnect interface 150. The interconnect modules 140 and 170 may be UCIe modules configured to communicate based on Universal Chiplet Interconnect Express (UCIe) standards, and may each include a controller and a PHY module. In addition, the first bus interface 120 and/or the second bus interface 190 may be an Advanced extensible Interface (AXI) type interface.

The first save and forward module 130 may include a first data buffer 132, and the second save and forward module 180 may include a second data buffer 182. The first data buffer 132 may temporarily store at least a portion of the transaction received from the first bus interface 120 or the first interconnect module 140. Likewise, the second data buffer 182 may temporarily store at least a portion of the transaction received from the second bus interface 190 or the second interconnect module 170.

The first save and forward module 130 may receive a transaction from the first bus interface 120. The first save and forward module 130 may temporarily store at least a portion of the received transaction in the first data buffer 132. The first save and forward module 130 may transmit the transaction stored in the first data buffer 132 to the first interconnect module 140. The first interconnect module 140 may transmit the transmitted transaction to the second interconnect module 170 through the interconnect interface 150, and the second save and forward module 180 may receive the transaction from the second interconnect module 170. The second save and forward module 180 may temporarily store at least a portion of the received transaction in the second data buffer 182. The second save and forward module 180 may transmit the transaction stored in the second data buffer 182 to the second bus interface 190. The process of transmitting and receiving transactions may proceed in reverse order. For example, the second save and forward module 180 may receive a transaction from the second bus interface 190 and transmit it to the second interconnect module 170, and the second interconnect module 170 may transmit the transaction to the first interconnect module 140 through the interconnect interface 150. The first save and forward module 130 may receive a transaction from the first interconnect module 140 and transmit the transaction to the first bus interface 120. Likewise, in this process, the first save and forward module 130 and the second save and forward module 180 may store at least a portion of the received transaction in the first data buffer 132 and the second data buffer 182, respectively.

The transactions transmitted and received between the first chiplet 110 and the second chiplet 160 may be divided into predetermined units for transmission and reception. For example, the transaction may be a burst transaction transmitted with a burst transfer method, and the burst transaction may include a plurality of beats. In this case, the burst transaction may be transmitted and received in units of beats.

While the internal configurations of the first chiplet 110 and the second chiplet 160 are illustrated in FIG. 1, it is to be noted that internal configurations other than those necessary to explain transmission and reception of information between the first chiplet 110 and the second chiplet 160 may be omitted. For example, the second chiplet 160 may further include another interconnect management module and another interconnect module connected to the second bus interface 190, thereby being further connected to another chiplet adjacent to the second chiplet 160. In addition, the first chiplet 110 and the second chiplet 160 may further include various functional modules for performing various functions (e.g., computation, recording, etc.).

Likewise, FIG. 1 illustrates that the save and forward modules 130 and 180 include only the data buffers 132 and 182, but aspects are not limited thereto, and the save and forward modules 130 and 180 may include configurations for performing various functions. A detailed example of the configuration of the save and forward modules 130 and 180 will be described below with reference to FIG. 3.

In addition, FIG. 1 illustrates that the chiplets 110 and 160 include a single save and forward module 130 and 180, respectively, but aspects are not limited thereto. For example, each of the chiplets 110 and 160 may separately include a receiver side (Rx) save and forward module and a transmitter side (Tx) save and forward module. In this case, the chiplets 110 and 160 may use the Rx save and forward module when receiving a transaction from another chiplet, and use the Tx save and forward module when transmitting a transaction to another chiplet.

In addition, FIG. 1 illustrates that the first save and forward module 130, the first interconnect module 140, the second save and forward module 180, and the second interconnect module 170 have different configurations, but aspects are not limited thereto. For example, the first save and forward module 130 may be included in the first interconnect module 140, and the second save and forward module 180 may be included in the second interconnect module 170.

Figure 2:
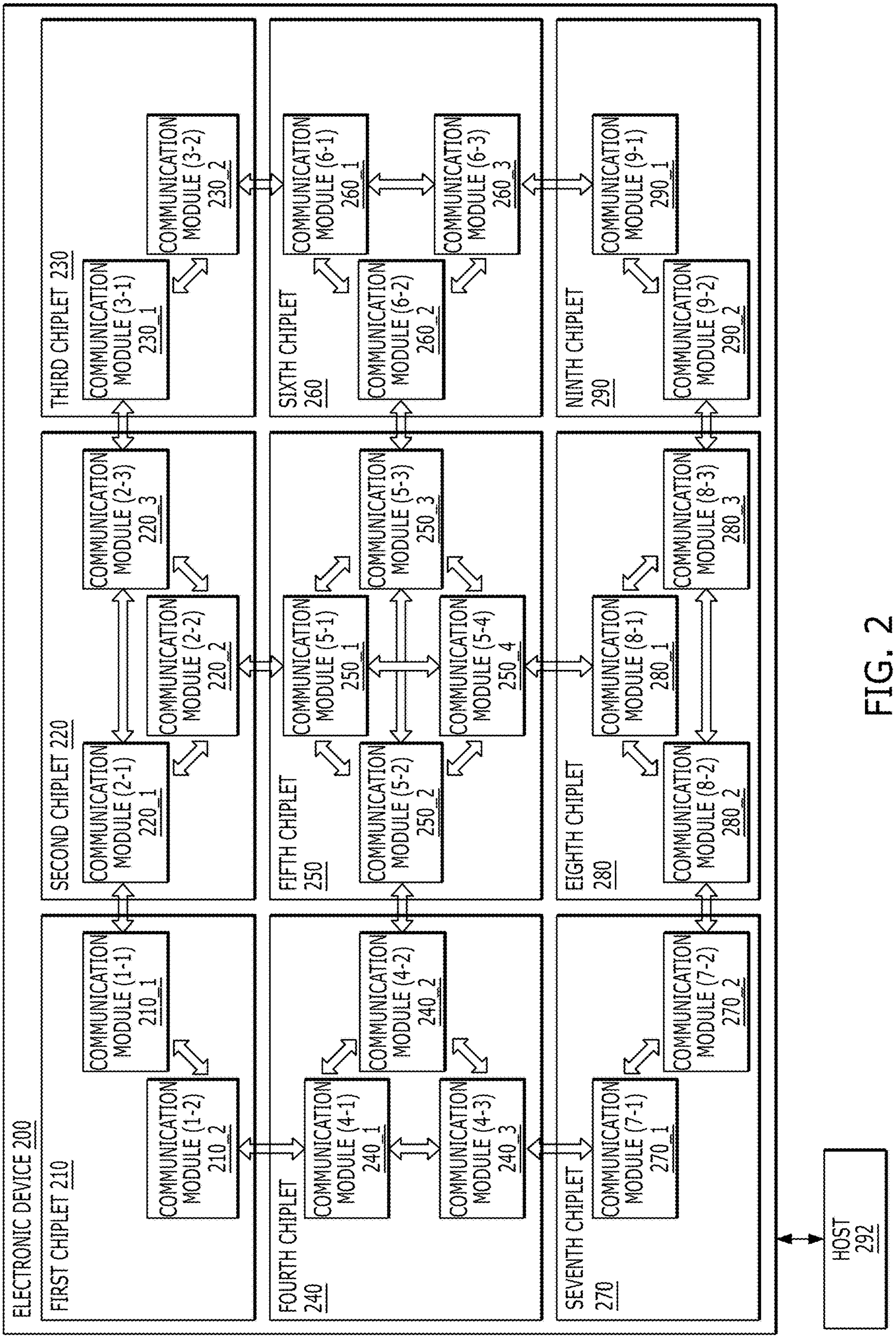
FIG. 2 is a diagram illustrating an example of an electronic device.

FIG. 2 is a diagram illustrating an example of an electronic device 200. Referring to FIG. 2, the electronic device 200 may include a plurality of chiplets. For example, the electronic device 200 may include a first chiplet 210, a second chiplet 220, a third chiplet 230, a fourth chiplet 240, a fifth chiplet 250, a sixth chiplet 260, a seventh chiplet 270, an eighth chiplet 280, and a ninth chiplet 290. However, the number of chiplets included in the electronic device 200 is not limited to the above. According to various aspects, the electronic device 200 may omit at least one of the chiplets described above, and may further include at least one more additional chiplet. In addition, the arrangement of chiplets included in the electronic device 200 is not limited to those illustrated herein, and the chiplets may be arranged in various other ways according to the purpose. The electronic device 100 including a plurality of chiplets may be packaged, and thus may be referred to as a packaged device or chiplet system.

Each of the plurality of chiplets may include various components such as a processing core, a memory, an input/output (I/O) interface, a power management circuit, a control logic, an Analog-to-Digital Converter (ADC), a Digital-to-Analog Converter (DAC), a memory, etc. Each of the plurality of chiplets may be a chiplet including the same component and performing the same or similar function. Alternatively, at least some of the plurality of chiplets may be chiplets that include different components and perform similar or different functions.

Each of the plurality of chiplets may include one or more communication modules. Each of the plurality of chiplets may include one or more communication modules capable of communicating with each of the other chiplets adjacent to each of the plurality of chiplets. For example, the first chiplet 210 may include a communication module (1-1) 210_1 and a communication module (1-2) 210_2, and the second chiplet 220 may include a communication module (2-1) 220_1, a communication module (2-2) 220_2, and a communication module (2-3) 220_3. In addition, the fifth chiplet 250 may include a communication module (5-1) 250_1, a communication module (5-2) 250_2, a communication module (5-3) 250_3, and a communication module (5-4) 250_4. A chiplet including the same number of communication modules may be implemented in the same architecture. For example, the fourth chiplet 240 and the sixth chiplet 260 may be implemented in the same architecture, but may be combined with different chiplets in different directions. For example, a communication module (4-1) 240_1 and a communication module (6-1) 260_1, a communication module (4-2) 240_2 and a communication module (6-2) 260_2, and a communication module (4-3) 240_3 and a communication module (6-3) 260_3 may correspond to each other.

Alternatively, each of the plurality of chiplets may include the same number of communication modules. For example, each of the plurality of chiplets included in the electronic device 200 as well as the fifth chiplet 250 may include four communication modules, and in FIG. 2, a communication module in a direction without an adjacent chiplet may be omitted for convenience of explanation.

The communication module may include a controller and a PHY layer. Additionally, the communication module may include the save and forward module, the interconnect module, etc. of FIG. 1.

Each of the plurality of chiplets may be connected to each other through the communication module and the interconnect interface (indicated by an arrow between communication modules of different chiplets in FIG. 2). For example, the fifth chiplet 250 and the eighth chiplet 280 may be connected to each other via the communication module (5-4) 250_4, a communication module (8-1) 280_1, and an interface. The chiplet interconnect interface may refer to a die-to-die interface, and may include, for example, a Universal Chiplet Interconnect Express (UCIe), etc.

Each of the communication modules in a plurality of chiplets may be connected to each other through a bus interface (indicated by an arrow between communication modules in one chiplet in FIG. 2). For example, a communication module (3-1) 230_1 and a communication module (3-2) 230_2 in the third chiplet 230 may be connected to each other through a bus interface. Likewise, a communication module (9-1) 290_1 and a communication module (9-2) 290_2 in the ninth chiplet 290 may be connected to each other through a bus interface. Additionally, aspects are not limited to the communication between communication modules, and components in each chiplet may communicate with other components through a bus interface, etc. The bus interface may be an Advanced extensible Interface (AXI) type interface. For example, each of the communication modules in a plurality of chiplets may be connected to each other through an AXI master port and an AXI slave port, and each of the AXI master port and the AXI slave port may include a read port and a write port. In this case, the AXI master port and the AXI slave port may be included in the save and forward module of the communication module.

Information may be transmitted and received within the electronic device 200 using the communication module, the interconnect interface, and/or the bus interface of each of the plurality of chiplets. For example, when information is transmitted from the fourth chiplet 240 to the ninth chiplet 290, the information may be transmitted to the ninth chiplet 290 through the communication module (4-3) 240_3, a communication module (7-1) 270_1, a communication module (7-2) 270_2, a communication module (8-2) 280_2, a communication module (8-3) 280_3, and a communication module (9-2) 290_2 in that order. Alternatively, when information is transmitted from the fourth chiplet 240 to the ninth chiplet 290, the information may be transmitted to the ninth chiplet 290 through the communication module (4-2) 240_2, the communication module (5-2) 250_2, the communication module (5-3) 250_3, the communication module (6-2) 260_2, the communication module (6-3) 260_3, and the communication module (9-1) 290_1 in that order. The path for routing the information from a specific chiplet to another chiplet may be determined by the architecture of the chiplet system or may be determined by various routing algorithms such as the Dijkstra algorithm, the Bellman-Ford algorithm, etc., although aspects are not limited thereto.

Any one of the plurality of chiplets (e.g., the first chiplet 210, etc.) may be connected to an external device (e.g., the host 192, etc.) through a host interface. For example, if an abnormality occurs during the transaction transfer process, the first chiplet 210 may generate an interrupt for the abnormality and transmit the interrupt to the host 192. In this case, the other chiplets (e.g., the second chiplet 220, etc.) may be restricted from communicating with external devices. The chiplet (e.g., the first chiplet 210) communicating with the external device may be referred to as a main chiplet, a primary die, a base chiplet, etc., and the other chiplets (e.g., the second chiplet 220, etc.) restricted from communicating with the external device may be referred to as sub-chiplets, secondary dies, partner chiplets, etc. The host interface connecting a host 292 to the electronic device 200 or the main chiplet may include a Peripheral Component Interconnect Express (PCIe), etc.

The electronic device 200 including a plurality of chiplets, that is, the chiplet system may extend the functions of the host 292 (or the host system) and perform parallel processing for at least some functions. For example, the host 292 may distribute tasks related to at least some functions to the chiplet system, and the chiplet system may process the distributed tasks in parallel. Furthermore, the host 292 may deal with a problem occurring in the process of processing a task of the chiplet system. For example, if a problem occurs during the transaction transfer process, any one (e.g., the first chiplet 210, etc.) of the plurality of chiplets may generate an interrupt and transmit it to the host 292, and the host 292 may identify and deal with the problem based on the received interrupt. This not only enables the optimization and enhancement of the overall performance of the system including the host 292 and the chiplet system, but also provides a scalable computing environment. The chiplet system may perform functions of a multi-processor, a memory controller, a cache, a network interface, etc.

The electronic device 200 and the host 292 may correspond to the electronic device 100 and the host 192 of FIG. 1, respectively, and the first chiplet 210 and the second chiplet 220 may correspond to the first chiplet 110 and the second chiplet 160 of FIG. 1.

Figure 3:
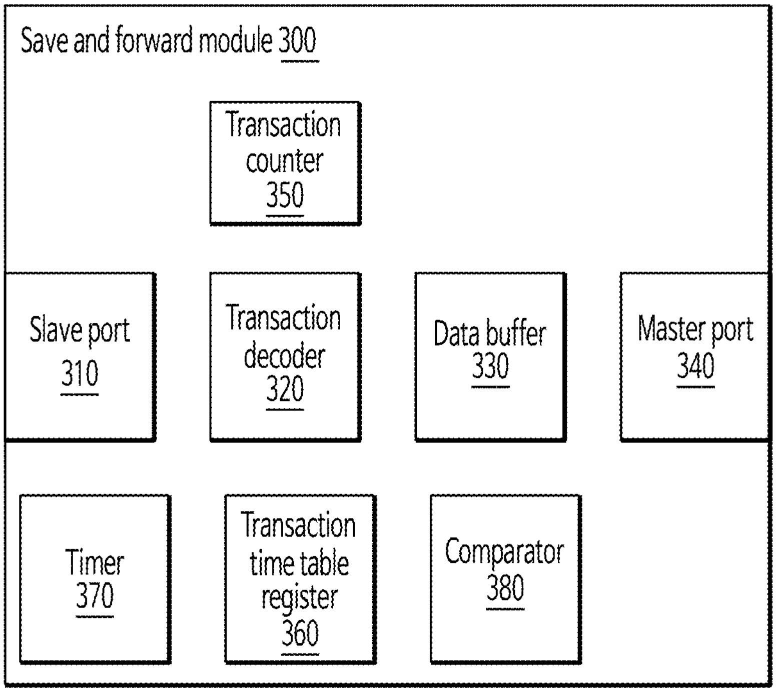
FIG. 3 is a diagram illustrating an example of a save and forward module.

FIG. 3 is a diagram illustrating an example of a save and forward module 300. The save and forward module 300 may correspond to the first save and forward module 130 and the second save and forward module 180 of FIG. 1. In addition, as illustrated in FIG. 3, the save and forward module 300 may include a slave port 310, a transaction decoder 320, a data buffer 330, a master port 340, a transaction counter 350, a transaction time table register 360, a timer 370, and a comparator 380. The save and forward module 300 may be included in a transmitter side communication interface and/or may be included in a receiver side communication interface.

The slave port 310 may receive a transaction from an interconnect module or a bus interface. For example, in the case of a save and forward module a receiver side chiplet, the slave port 310 may receive a transaction from an interconnect module that received a transaction from another chiplet. As another example, in the case of a save and forward module of a transmitter side chiplet, the slave port 310 may receive a transaction from a bus interface in the chiplet. In addition, the slave port 310 may receive the transaction divided into predetermined units (e.g., beats, etc.), and, whenever a portion of the transaction is received, transmit/save the same to/in the data buffer 330 (to be described below). Accordingly, access to the slave port 310, the interconnect module, and/or the bus interface of other functional modules within the chiplet may be allowed during the transaction transfer process.

The transaction decoder 320 may receive the corresponding transaction from the slave port 310 before the received transaction is transmitted to the data buffer 330. In addition, the transaction decoder 320 may receive information associated with the transaction and perform a function associated with the transaction. For example, the transaction decoder 320 may receive control information included in a first beat of the transaction transmitted in units of beats, and may determine based on the control information that the transaction is a burst transaction transmitted with a burst transfer method. In this case, the transaction decoder 320 may transmit/save the beats of the transaction received from the slave port 310 to/in the data buffer 330. In this case, the control information may include details of the burst transaction, such as an ID, a burst length, a burst size, a burst type, a burst sequence, etc. of the transaction.

Additionally or alternatively, the transaction decoder 320 may transmit the control information to the transaction counter 350 and the transaction time table register 360 to be described below. The transaction counter 350 may utilize the information on the burst length and the burst size of the transaction included in the received control information to determine whether all beats of the transaction are received. In addition, in response to receiving the control information (e.g., ID of the transaction, etc.), the time table register 360 may start recording the data related to the transaction in the transaction time table.

Additionally or alternatively, if the last beat of the transaction is received from the slave port 310, the transaction decoder 320 may transmit a signal to the transaction time table register 360 and the transaction counter 350. In response to this signal, the transaction counter 350 may determine whether all beats of the transaction are received. In response to determining that all beats of the transaction are received, the transaction counter 350 may cause the master port 340, which will be described below, to transmit all beats of the transaction saved in the data buffer through the master port 340. In addition, the transaction time table register 360 may record a transmission end time of the transaction in the transaction time table.

The data buffer 330 may temporarily store at least a portion of the transaction received through the slave port 310. For example, the data buffer 330 may sequentially store the beats of transactions received from the slave port 310. In this case, the save and forward module 300 may store the transaction without transmitting the transaction until all beats of the transaction are stored in the data buffer 330. By temporarily storing the beats of the transaction, the data buffer 330 may prevent a time bubble that may occur in the burst transaction and may efficiently use resources throughout the chiplet system.

The master port 340 may transmit the transaction stored in the data buffer to the interconnect module or the bus interface. For example, in the case of the save and forward module of the receiver side chiplet, the master port 340 may transmit the transaction to the bus interface in the chiplet. As another example, in the case of the save and forward module of the transmitter side chiplet, the master port 340 may transmit the transaction to the interconnect module. In addition, in response to determining that the entire transaction divided into predetermined units is stored in the data buffer 330, the master port 340 may transmit the transaction stored in the data buffer 330 to the interconnect module or the bus interface.

The transaction counter 350 may receive information associated with the transaction from the transaction decoder 320. For example, the transaction counter 350 may receive the control information from the transaction decoder 320. As another example, the transaction counter 350 may receive a signal indicating that the last beat of the transaction is received from the transaction decoder 320.

The transaction counter 350 may determine whether all beats of the transaction are received. For example, the transaction counter may compare the burst length and the burst size included in the control information with the data size (number of beats) of the transaction received by the slave port to determine whether all beats of the transaction are received.

If it is determined that all beats of the transaction are received, the transaction counter 350 may cause the master port 340 to transmit all beats of the transaction stored in the data buffer to the bus interface or interconnect module. On the other hand, if it is determined that all transaction beats are not received within a predetermined time (e.g., a predetermined error time threshold), the transaction counter may generate and transmit an error signal to an interrupt handler (not illustrated). This will be described in detail below with reference to FIG. 5.

The transaction time table register 360 may manage a transaction time table associated with the transaction. For example, the transaction time table register 360 may record information associated with the transaction in the transaction time table in response to receiving the control information from the transaction decoder 320. In this case, the transaction time table register 360 may use the timer 370. The transaction time table may include at least one of a validity of the transaction, an ID of the transaction, a transmission start time, a transmission end time, an error occurrence time, or an error flag. This will be described in more detail below with reference to FIGS. 6 and 7.

The comparator 380 may determine whether a predetermined error time threshold has been exceeded since the transmission time of the transaction recorded in the time table of the transaction. For example, the comparator 380 may receive the transmission start time of the transaction and the current time from the transaction time table register 360 and the timer 370 and calculate the transmission time of the transaction. The comparator 380 may compare the transmission time of the transaction with a predetermined error time threshold to determine whether it exceeds the error time threshold. If it is determined that the transmission time of the transaction exceeds the predetermined error time threshold, the comparator 380 may generate and transmit an error signal to an interrupt handler (not illustrated).

The internal configurations of the save and forward module 300 illustrated in FIG. 3 are illustrated only by way of an example, and at least some configurations may be omitted or other configurations may be added. In addition, at least some of the operations or processes performed by the save and forward module 300 may be implemented differently, such as being performed by a configuration of the chiplet other than the save and forward module 300. In addition, each of the configurations of the save and forward module 300 illustrated in FIG. 3 may be implemented in the form of hardware and/or software.

FIG. 3 illustrates that the configuration of the save and forward module 300 is classified for each function, but it does not necessarily mean that it is physically classified. For example, the transaction time table register 360 and the timer 370 have been described separately, but this is to help understand the disclosure and aspects are not limited thereto.

Figure 4:
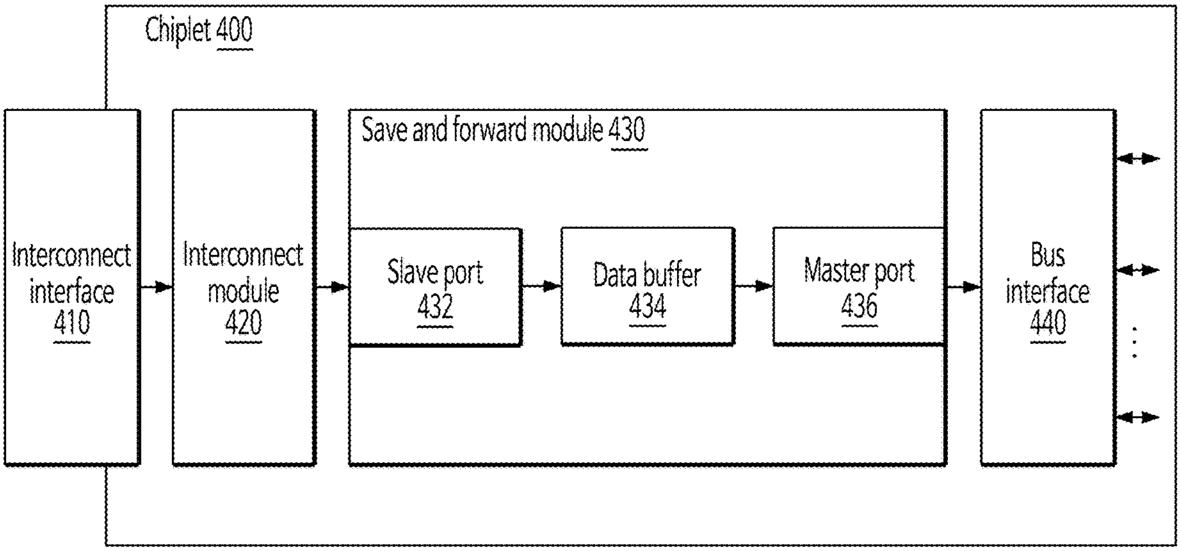
FIG. 4 is a diagram illustrating an example of a transaction transfer process.

FIG. 4 is a diagram illustrating an example of a transaction transfer process. A chiplet 400 may include an interconnect module 420, a save and forward module 430, and a bus interface 440. In addition, the save and forward module 430 may include a slave port 432, a data buffer 434, and a master port 436.

The interconnect module 420 may receive a transaction from another chiplet through an interconnect interface 410. The interconnect module 420 may transmit the received transaction to the slave port 432 of the save and forward module 430. In this case, the transaction may be divided into predetermined units (e.g., beats, etc.) and transmitted.

The slave port 432 may receive the transaction from the interconnect module 420 and transmit the transaction to a data buffer 424. For example, the slave port 432 may receive a burst transaction including a plurality of beats from the interconnect module 420 in units of beats, and transmit the beats of the received transaction to the data buffer 434. In this case, whenever the slave port 432 receives the plurality of beats included in the transaction in the units of beats, the slave port 432 may transmit the plurality of beats to the data buffer 434. As a result, while some of the plurality of beats are stored in the data buffer 424, access to the slave port 432 and/or the interconnect module 420 of at least one functional module included in the chiplet 400 may be allowed.

The data buffer 434 may temporarily store at least a portion of the received transaction. For example, the data buffer 434 may sequentially store beats of the transaction received from the slave port 432. In addition, transmission of at least one beat of the transaction stored in the data buffer

434 may not be performed until all of the plurality of beats included in the transaction are stored. In addition, the size of the data buffer may be determined based on the data size of the transaction. For example, the size of the data buffer may be greater than or equal to the data of the transaction.

The master port 436 may transmit the transaction stored in the data buffer 434 to the bus interface 440. In this case, in response to determining that entire transaction is stored in the data buffer, the master port 436 may transmit the entire transaction to the bus interface 440.

FIG. 4 illustrates that the slave port 432 receives the transaction from the interconnect module 420 and the master port 436 transmits the transaction to the bus interface 440, but aspects are not limited thereto. For example, the slave port 432 may receive the transaction from the bus interface 440, and the master port 436 may transmit the transaction to the interconnect module 420. In this case, the interconnect module 420 may transmit the transaction received from the master port 436 to another chiplet through the interconnect interface 410. The save and forward module may be implemented as a module separate from the save and forward module 430 or may be implemented within the save and forward module 430.

With the configuration described above, the chiplet 400 may store at least a portion of the transaction received through the slave port 432 using the data buffer 434 of the save and forward module 430. As a result, a problem of unnecessary occupation of the resources due to communication abnormality may be prevented.

Figure 5:
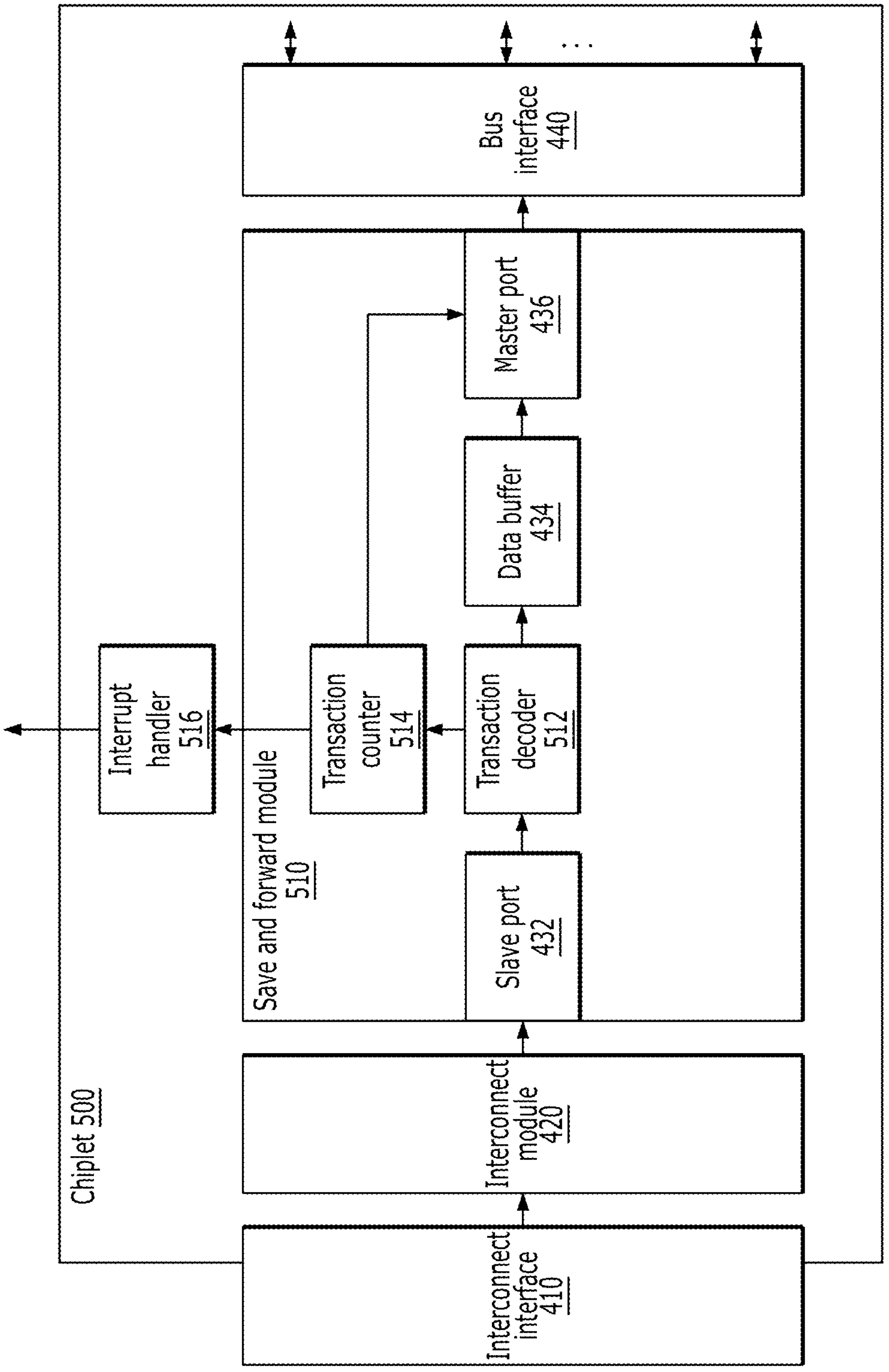
FIG. 5 is a diagram illustrating an example of a transaction transfer process according to another aspect.

FIG. 5 is a diagram illustrating an example of a transaction transfer process according to another aspect. A chiplet 500 may include the interconnect module 420, a save and forward module 510, and the bus interface 440. In addition, the save and forward module 430 may include the slave port 432, the data buffer 434, the master port 436, a transaction decoder 512, and a transaction counter 514. Configurations in FIG. 5 overlapping with those of FIG. 4 will be briefly described based on the aspect illustrated in FIG. 5.

The interconnect module 420 may receive a transaction from another chiplet through the interconnect interface 410. In addition, the slave port 432 may receive the transaction from the interconnect module 420 and transmit it to the transaction decoder 512.

The transaction decoder 512 may receive the transaction and information associated with the transaction from the slave port 432. For example, the transaction decoder 512 may receive the control information included in the first beat of the burst transaction transmitted in units of beats. In this case, the control information may include details of the burst transaction, such as an ID, a burst length, a burst size, a burst type, a burst sequence, etc. of the transaction.

Based on the received control information, the transaction decoder 512 may determine that the received transaction is the burst transaction. The transaction decoder 512 may store the beats of the transaction received from the slave port 432 in the data buffer 434.

The transaction decoder 512 may transmit the received control information to the transaction counter 514. In addition, in response to receiving the last beat of the transaction, a first signal may be transmitted to the transaction counter 514, indicating that the last beat of the transaction is received. In response to the first signal, the transaction counter 514 may determine whether all beats of the transaction are received. For example, the transaction counter 514 may determine whether the product of the burst length and the burst size included in the received control information is equal to the data size (number of beats) of the received transaction, and if so, may determine that all beats of the transaction are received.

If it is determined that all beats of the transaction are received, the transaction counter 514 may transmit a second signal to transmit the transaction to the master port 436. In response to the second signal, the master port 436 may transmit all beats of the transaction stored in the data buffer 434 to the bus interface 440. On the other hand, if it is determined that all beats of the transaction are not received, the transaction counter 514 may generate and transmit an error signal to an interrupt handler 516. Based on the error signal, the interrupt handler 516 may generate an interrupt requesting the host (not illustrated) to process the error and transmit the interrupt to the host (not illustrated). The host may be a host inside the chiplet 500 and/or a host outside the chiplet 500. Through the process described above, the host may clearly recognize a transaction loss problem that may occur in the communication process between chiplets.

FIG. 5 illustrates that the slave port 432 receives the transaction from the interconnect module 420 and the master port 436 transmits the transaction to the bus interface 440, but aspects are not limited thereto. For example, the slave port 432 may receive the transaction from the bus interface 440, and the master port 436 may transmit the transaction to the interconnect module 420. In this case, the interconnect module 420 may transmit the transaction received from the master port 436 to another chiplet through the interconnect interface 410. The save and forward module may be implemented as a module separate from the save and forward module 510 or may be implemented within the save and forward module 510.

In addition, the internal configurations of the save and forward module 510 are illustrated in FIG. 5, but it is to be noted that some configurations other than those necessary to explain the transaction transfer process may be omitted. For example, the save and forward module 510 may further include at least some components included in the save and forward module of FIG. 6 to be described below.

Figure 6:
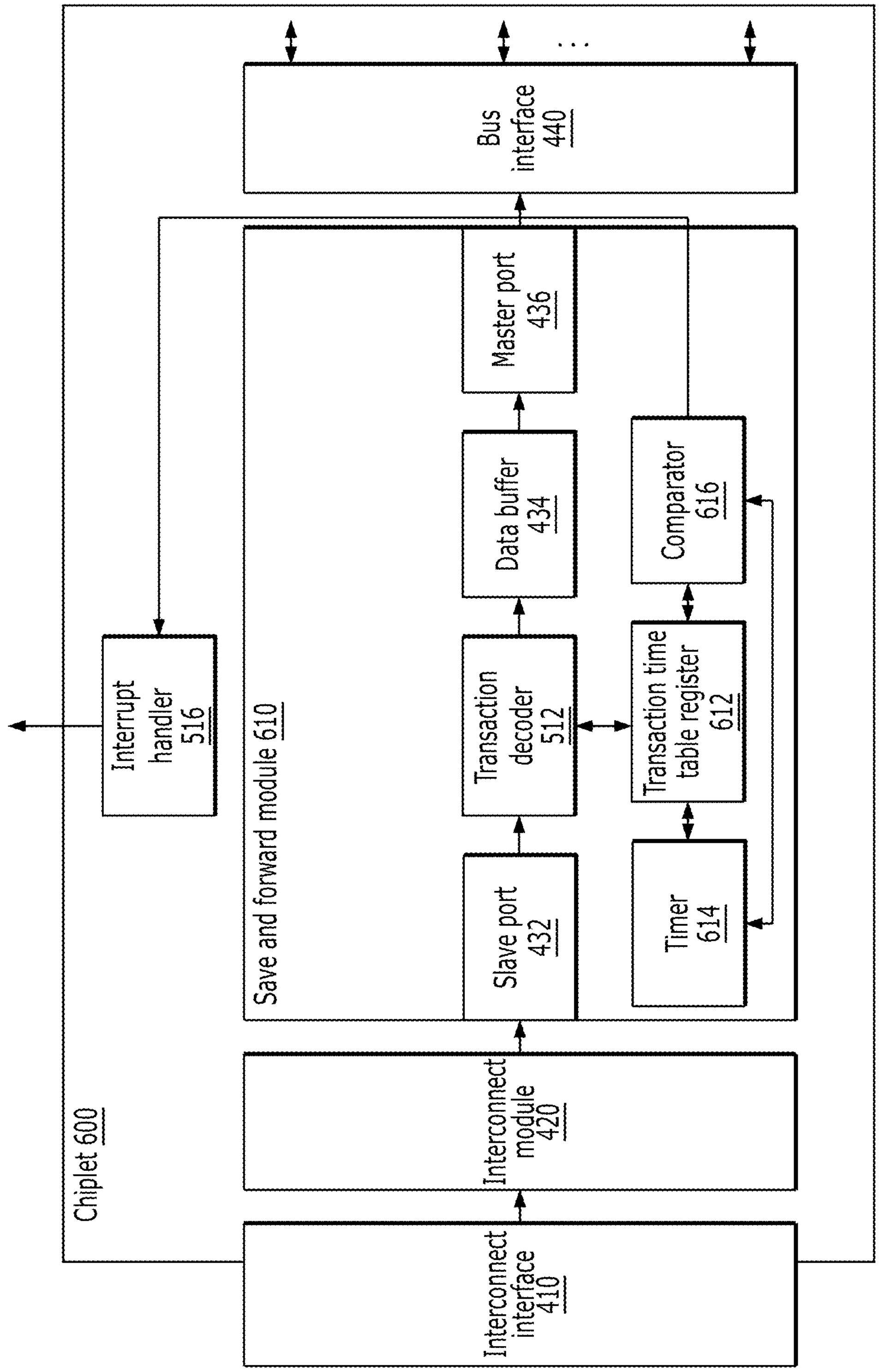
FIG. 6 is a diagram illustrating an example of a transaction transfer process according to still another aspect.

FIG. 6 is a diagram illustrating an example of generating an interrupt according to another aspect. A chiplet 600 may include the interconnect module 420, a save and forward module 610, and the bus interface 440. In addition, the save and forward module 430 may include the slave port 432, the transaction decoder 512, the data buffer 434, the master port 436, a transaction time table register 612, a timer 614, and a comparator 616. Configurations in FIG. 6 overlapping with those of FIGS. 4 and 5 will be briefly described based on the aspect illustrated in FIG. 5.

The interconnect module 420 may receive a transaction from another chiplet through the interconnect interface 410. In addition, the slave port 432 may receive the transaction from the interconnect module 420 and transmit it to the transaction decoder 512.

The transaction decoder 512 may receive the transaction and information associated with the transaction from the slave port 432. For example, the transaction decoder 512 may transmit the received control information to the transaction time table register 612. In response to receiving the control information, the transaction time table register 612 may start recording the data related to the transaction in the transaction time table. For example, the transaction time table register 612 may receive the control information from the transaction decoder 512 and record the ID of the received transaction in the transaction time table, and use the timer 614 to record the transmission start time of the transaction.

If the last beat of the transaction is received from the slave port 432, the transaction decoder 512 may transmit a signal indicating that the entire transaction is received in the transaction time table register 612. In response to the corresponding signal, the transaction time table register 612 may record the transmission end time of the transaction.

The comparator 616 may monitor whether transaction transfer is performed without abnormality. For example, the comparator 616 may receive the transmission start time of the transaction from the transaction time table register 360 (e.g., the time when the first beat is received from the burst transaction) and receive the current time from the timer 614. The comparator 616 may calculate a transmission time of the transaction from the current time and the transmission start time of the transaction, and may determine whether the calculated transmission time exceeds a predetermined error time threshold. In one example, the error time threshold may be set during the initialization operation of the electronic device or the chiplet. In another example, the error time threshold may be set during a run time of the electronic device or the chiplet.

If the transmission time does not exceed the predetermined error time threshold, the comparator 616 may not generate an error signal. Accordingly, the transaction time table register 612 may determine that this transaction is valid, and may not record the error occurrence time and the error flag in the transaction time table. In addition, the transaction decoder 512 may transmit the received transaction to the data buffer 434, and the master port 436 may transmit the entire transaction temporarily stored in the data buffer 434 to the bus interface 440.

On the other hand, if the transmission time exceeds the predetermined error time threshold, the comparator 616 may generate an error signal and transmit the generated error signal to the transaction time table register 612 and the interrupt handler 516. Based on the error signal, the transaction time table register 612 may determine that this transaction is invalid, and record the error occurrence time and the error flag in the transaction time table. Based on the error signal, the interrupt handler 516 may generate an interrupt requesting the host (not illustrated) to process the error and transmit the interrupt to the host (not illustrated). As another example, the host may check/determine whether an error occurs by checking the error flag recorded in the transaction time table, and may take appropriate measures for the occurred error based on the result of check/determination.

Through the process described above, the host may clearly recognize a transaction transmission delay problem that may occur in the communication process between chiplets. In addition, the host may check the transaction time table to clearly identify which transaction encountered which problem at which point in time.

FIG. 6 illustrates that the slave port 432 receives the transaction from the interconnect module 420 and the master port 436 transmits the transaction to the bus interface 440, but aspects are not limited thereto. For example, the slave port 432 may receive the transaction from the bus interface 440, and the master port 436 may transmit the transaction to the interconnect module 420. In this case, the interconnect module 420 may transmit the transaction received from the master port 436 to another chiplet through the interconnect interface 410. The save and forward module may be implemented as a module separate from the save and forward module 610 or may be implemented within the save and forward module 610.

In addition, the internal configurations of the save and forward module 610 are illustrated in FIG. 6, but it is to be noted that some configurations other than those necessary to explain the transaction transfer process may be omitted. For example, the save and forward module 610 may further include the transaction counter 514 included in the save and forward module 510 of FIG. 5. In this case, the transaction time table register 612 may record an error occurrence time and an error flag based on the error signal generated by the transaction counter 514.

FIG. 7 is a diagram illustrating an example of a transaction time table 700. The transaction time table 700 may be managed by a transaction time table register (e.g., the transaction time table register 360 of FIG. 3). As illustrated in FIG. 7, the transaction time table 700 may include, as attributes, a validity 710 of the transaction, an ID 720 of the transaction, a transmission start time 730, a transmission end time 740, an error occurrence time 750, and an error flag 760.

The validity 710 of the transaction relates to whether the transmitted transaction is valid. For example, if the received transaction is a burst transaction including a plurality of beats and if all of the beats of the transaction are received, the transaction time table register may determine that the received transaction is valid and record the result in the transaction time table 700. On the other hand, if the state in which the transaction is partially lost or the transaction is not fully received persists for a predetermined threshold or more, the transaction time table register may determine that the received transaction is invalid and record the result of determination in the transaction time table 700.

The ID 720 of the transaction relates to an ID that can identify the transaction. For example, the transaction time table register may record the ID of the transaction in the transaction time table 700 based on the received control information of the transaction.

The transmission start time 730 and the transmission end time 740 relate to times when the transaction transmission starts and ends. For example, in response to receiving control information of a transaction through a first beat of a burst transaction, the transaction time table register may record in the transaction time table 700 the time when the transaction transmission starts. In addition, in response to receiving a signal indicating that the entire transaction is received (e.g., a signal indicating that the last beat of the transaction is received), the transaction time table register may record in the transaction time table 700 the time when the transaction transmission ends.

The error occurrence time 750 and the error flag 760 relate to, when the transaction error occurs, the time of occurrence of the error and an indication indicating the occurrence of the error. For example, in response to receiving the error signal, the transaction time table register may record in the transaction time table 700 the time of occurrence of the transaction error and an indication (e.g., 0/1, true/false, etc.) indicating the occurrence of the error.

Although FIG. 7 illustrates that the transaction time table 700 includes as attributes the validity 710 of the transaction, the ID 720 of the transaction, the transmission start time 730, the transmission end time 740, the error occurrence time 750, and the error flag 760, aspects are not limited thereto, and some attributes may be added or omitted.

Figure 8:
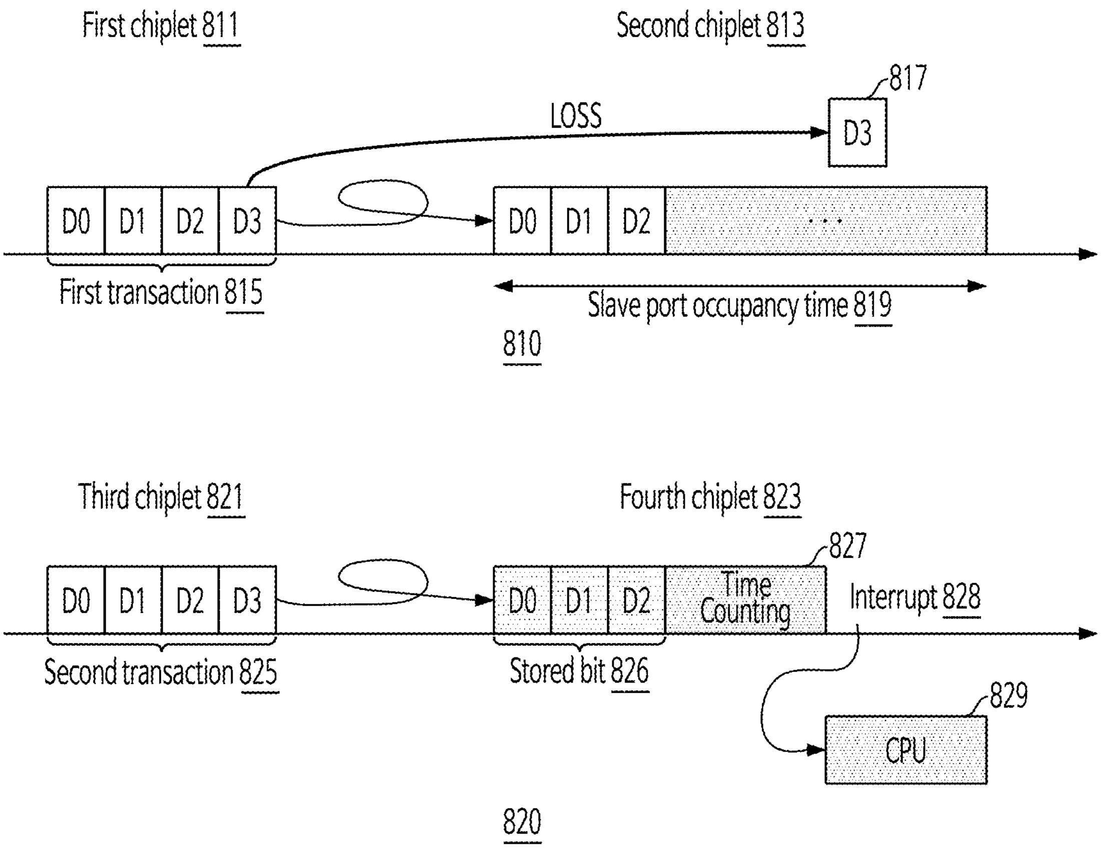
FIG. 8 is a diagram illustrating an example in which a portion of a transaction is lost in a transaction transfer process.

FIG. 8 is a diagram illustrating an example in which a portion of a transaction is lost in a transaction transfer process. A first example 810 represents an example in which a second chiplet 813 does not include a save and forward module. A second example 820 represents an example in which a fourth chiplet 823 includes a save and forward module.

In the first example 810, a first chiplet 811 may transmit a first transaction 815 to the second chiplet 813, and in this process, a portion 817 of the transaction may be lost. The transaction may be a burst transaction. In this case, the second chiplet 813, which does not include a save and forward module, has to wait until the entire transaction is received, and in this process, occupancy time 819 of slave ports (e.g., slave ports such as interconnect modules and bus interfaces) continues to increase.

In the second example 820, a third chiplet 821 may transmit a second transaction 825 to the fourth chiplet 823, and in this process, a portion of the second transaction may be lost. The transaction may be a burst transaction. In this case, unlike the first example, the fourth chiplet 823, which includes the save and forward module, may calculate (827) a transmission time of the transaction, and if the transmission time of the transaction exceeds a predetermined threshold, may generate an interrupt 828 to cause a CPU 829 (or host) to handle the problem. In addition, portions D0, D1, and D2 of the received burst transaction are stored in the save and forward module, and accordingly, even if some beats are lost during the burst transaction transfer process, access to slave ports, the interconnect modules, and/or the bus interfaces of the other functional modules in the chiplet is allowed, thus preventing a problem of unnecessary occupation of the resources due to communication abnormalities. Although FIG. 8 illustrates an example of a situation where the bubble occurs in the receiver side chiplet (e.g., the fourth chiplet 823), aspects are not limited thereto, and the similar effect may be expected even when the bubble occurs in the transmitter side chiplet (e.g., the third chiplet 821), with the transmitter side chiplet using a save and forward module.

Figure 9:
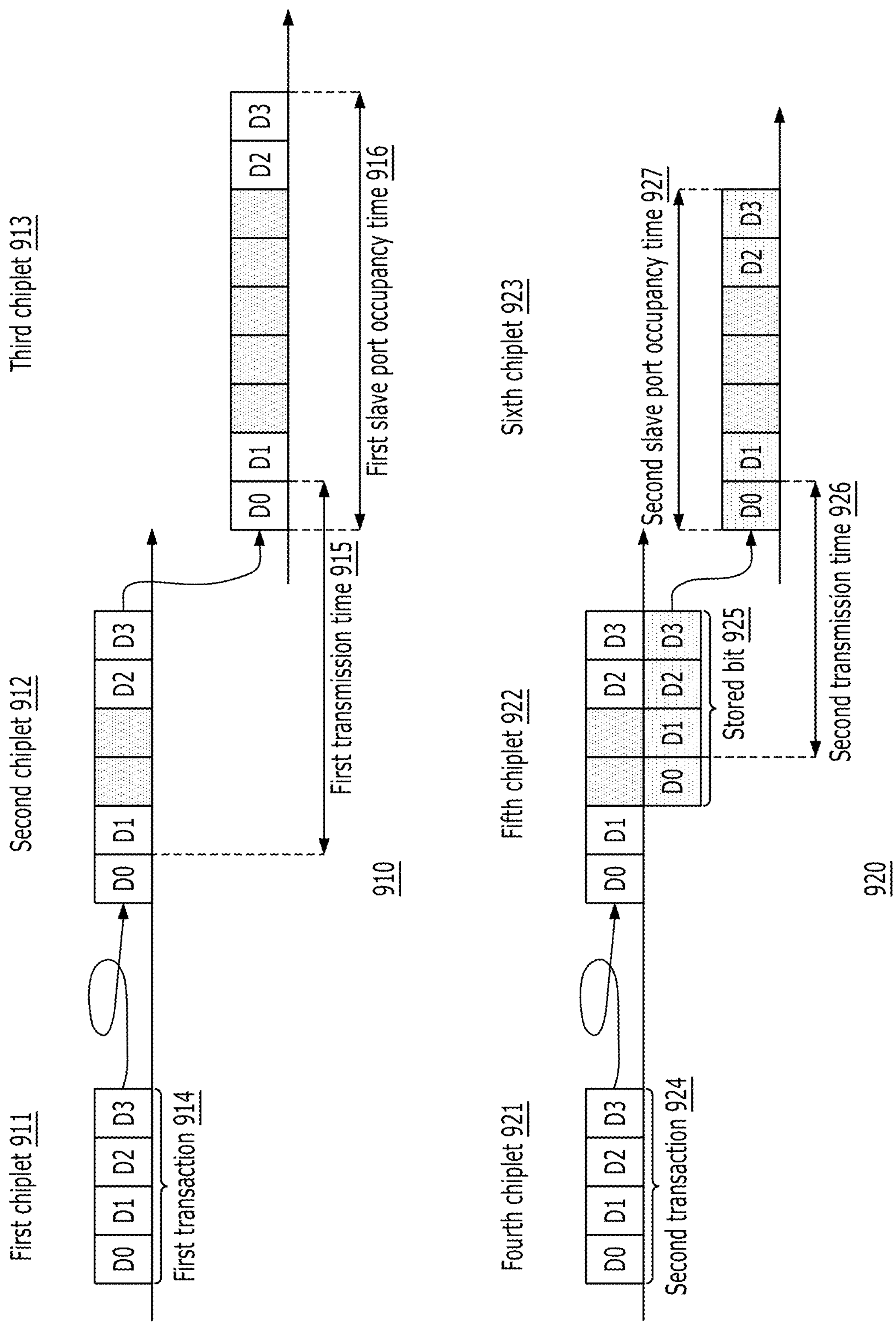
FIG. 9 is a diagram illustrating an example of transmitting and receiving a transaction between chiplets.

FIG. 9 is a diagram illustrating an example of transmitting and receiving a transaction between chiplets. A first example 910 illustrates an example in which a second chiplet 912 does not include a save and forward module. A second example 920 illustrates an example in which a fifth chiplet 922 includes a save and forward module.

In the first example 910, a first chiplet 911 may transmit a first transaction 914 to the second chiplet 912, and in this process, transaction transmission/reception may be delayed, resulting in time bubble. The transaction may be a burst transaction. In this case, since the second chiplet 912 does not include a save and forward module, the transaction including the time bubble is transmitted to a third chiplet 913, and in this process, a first transmission time 915 and a first slave port occupancy time 916 continue to increase as the number of relay chiplets increases.

In the second example 920, a fourth chiplet 921 may transmit a second transaction 924 to the fifth chiplet 922, and in this process, transaction transmission may be delayed, resulting in time bubble. The transaction may be a burst transaction. However, unlike the first example 910, since the fifth chiplet 922 includes a save and forward module, the beats may be stored in the data buffer such that time bubble may be removed, and after all beats of the burst transaction are stored in the save and forward module, the stored beats 925 may be transmitted to a sixth chiplet 923 such that a second transmission time 926 and a second slave port occupancy time 927 may be shortened. As described above, the chiplet including the save and forward module is capable of minimizing the resource occupancy time due to transaction transmission and reception.

Although FIG. 9 illustrates an example of a situation where the bubble occurs in the receiver side chiplet (e.g., the fifth chiplet 922), aspects are not limited thereto, and the similar effect may be expected even when the bubble occurs in the transmitter side chiplet (e.g., the fourth chiplet 921), with the transmitter side chiplet using a save and forward module.

The functions performed by each of the configurations described above may be provided as a computer program stored in a computer-readable recording medium for execution on a computer. The medium may be a type of medium that continuously stores a program executable by a computer, or temporarily stores the program for execution or download. In addition, the medium may be a variety of recording means or storage means having a single piece of hardware or a combination of several pieces of hardware, and is not limited to a medium that is directly connected to any computer system, and accordingly, may be present on a network in a distributed manner. An example of the medium includes a medium configured to store program instructions, including a magnetic medium such as a hard disk, a floppy disk, and a magnetic tape, an optical medium such as a CD-ROM and a DVD, a magnetic-optical medium such as a floptical disk, a ROM, a RAM, a flash memory, etc. In addition, other examples of the medium may include an app store that distributes applications, a site that supplies or distributes various software, and a recording medium or a storage medium managed by a server.

The methods, operations, or techniques of the present disclosure may be implemented by various means. For example, these techniques may be implemented in hardware, firmware, software, or a combination thereof. Those skilled in the art will further appreciate that various illustrative logical blocks, modules, circuits, and algorithm steps described in connection with the disclosure herein may be implemented in electronic hardware, computer software, or combinations of both. To clearly illustrate this interchange of hardware and software, various exemplary components, blocks, modules, circuits, and steps have generally been described above from their functional perspective. Whether such a function is implemented as hardware or software depends on design requirements imposed on the particular application and the overall system. Those skilled in the art may implement the described functions in varying ways for each particular application, but such implementation should not be interpreted as causing a departure from the scope of the present disclosure.

In a hardware implementation, processing units used to perform the techniques may be implemented in one or more ASICs, DSPs, digital signal processing devices (DSPDs), programmable logic devices (PLDs), field programmable gate arrays (FPGAs), processors, controllers, microcontrollers, microprocessors, electronic devices, other electronic units designed to perform the functions described in the present disclosure, computer, or a combination thereof.

Accordingly, various example logic blocks, modules, and circuits described in connection with the present disclosure may be implemented or performed with general purpose processors, DSPs, ASICs, FPGAs or other programmable logic devices, discrete gate or transistor logic, discrete hardware components, or any combination of those designed to perform the functions described herein. The general purpose processor may be a microprocessor, but in the alternative, the processor may be any related processor, controller, microcontroller, or state machine. The processor may also be implemented as a combination of computing devices, for example, a DSP and microprocessor, a plurality of microprocessors, one or more microprocessors associated with a DSP core, or any other combination of the configurations.

In the implementation using firmware and/or software, the techniques may be implemented with instructions stored on a computer-readable medium, such as random access memory (RAM), read-only memory (ROM), non-volatile random access memory (NVRAM), programmable read-only memory (PROM), erasable programmable read-only memory (EPROM), electrically erasable PROM (EEPROM), flash memory, compact disc (CD), magnetic or marking data storage devices, etc. The commands may be executable by one or more processors, and may cause the processor(s) to perform certain aspects of the functions described in the present disclosure.

If implemented in software, the techniques described above may be stored on a computer-readable medium as one or more commands or codes, or may be sent via a computer-readable medium. The computer-readable media include both the computer storage media and the communication media including any medium that facilitates the transmission of a computer program from one place to another. The storage media may also be any available media that may be accessible to a computer. By way of non-limiting example, such a computer-readable medium may include RAM, ROM, EEPROM, CD-ROM or other optical disk storage, magnetic disk storage or other magnetic storage devices, or any other media that can be used to transmit or store desired program code in the form of instructions or data structures and can be accessible to a computer. In addition, any connection is properly referred to as a computer-readable medium.

For example, if the software is sent from a website, server, or other remote sources using coaxial cable, fiber optic cable, twisted pair, digital subscriber line (DSL), or wireless technologies such as infrared, wireless, and microwave, the coaxial cable, the fiber optic cable, the twisted pair, the digital subscriber line, or the wireless technologies such as infrared, wireless, and microwave are included within the definition of the medium. The disks and the discs used herein include CDs, laser disks, optical disks, digital versatile discs (DVDs), floppy disks, and Blu-ray disks, where disks usually magnetically reproduce data, while discs optically reproduce data using a laser. The combinations described above should also be included within the scope of the computer-readable media.

The software module may reside in RAM memory, flash memory, ROM memory, EPROM memory, EEPROM memory, registers, hard disk, removable disk, CD-ROM, or any other form of storage medium known. An exemplary storage medium may be connected to the processor, such that the processor may read or write information from or to the storage medium. Alternatively, the storage medium may be integrated into the processor. The processor and the storage medium may be present in the ASIC. The ASIC may be present in the user terminal. Alternatively, the processor and storage medium may exist as separate components in the user terminal.

Although the examples described above have been described as utilizing aspects of the currently disclosed subject matter in one or more standalone computer systems, aspects are not limited thereto, and may be implemented in conjunction with any computing environment, such as a network or distributed computing environment. Furthermore, the aspects of the subject matter in the present disclosure may be implemented in multiple processing chips or devices, and storage may be similarly influenced across a plurality of devices. Such devices may include PCs, network servers, and portable apparatus.

Although the present disclosure has been described herein in connection with some aspects, various modifications and changes can be made without departing from the scope of the present disclosure, which can be understood by those skilled in the art to which the present disclosure pertains. In addition, such modifications and changes should be considered within the scope of the claims appended herein.

The invention claimed is:

1. A chiplet, comprising:
- an interconnect module for connecting to another chiplet;
- a bus interface for connecting to at least one functional module in the chiplet; and
- a save and forward module connected to the interconnect module and the bus interface, wherein
- the save and forward module comprises:
- a slave port that receives a transaction from one of the interconnect module or the bus interface;
- a data buffer that temporarily stores at least a portion of the transaction;
- a transaction counter that determines whether all a plurality of beats of the transaction are received based on a comparison between a number of beats received in the transaction to a product of a burst length and a burst size of the transaction received in control information; and
- a master port that transmits the transaction stored in the data buffer to the other one of the interconnect module or the bus interface,
- the transaction is divided into predetermined units and transmitted, and
- while at least the portion of the transaction is stored in the data buffer, access to the slave port, by the at least one functional module, is allowed, and
- wherein the transaction counter generates and transmits an error signal to an interrupt handler based at least in part on determining less than all the plurality of the beats of the transaction are received within a predetermined error time threshold.

2. The chiplet according to claim 1, wherein, in response to determining that entire transaction is stored in the data buffer, the master port transmits the entire transaction.

3. The chiplet according to claim 1, wherein
- the transaction is a burst transaction transmitted with a burst transfer method,
- the burst transaction comprises a plurality of beats, and
- the predetermined unit is a beat unit.

4. The chiplet according to claim 3, wherein the save and forward module further comprises:
- a transaction decoder that receives the plurality of beats from the slave port; and
- the transaction counter that receives information associated with each beat received from the transaction decoder.

5. The chiplet according to claim 4, wherein the transaction counter determines whether all of the plurality of beats are received, and in response to determining that all of the plurality of beats are received, causes the master port to transmit all of the plurality of beats stored in the data buffer.

6. The chiplet according to claim 4, wherein the transaction decoder determines that the transaction is a burst transaction, based on control information included in a first beat received from the slave port.

7. The chiplet according to claim 6, wherein, in response to determining that the transaction is the burst transaction, the transaction decoder stores the beats received from the slave port in the data buffer.

8. The chiplet according to claim 6, wherein the transaction counter generates the error signal based on the control information and a data size of the transaction.

9. The chiplet according to claim 8, wherein the save and forward module further comprises the interrupt handler, and the interrupt handler receives the error signal from the transaction counter, generates a first interrupt based on the first error signal, and transmits the first interrupt to a host.

10. The chiplet according to claim 4, wherein the save and forward module further comprises a transaction time table register that manages a transaction time table associated with the transaction.

11. The chiplet according to claim 10, wherein the transaction time table comprises at least one of a validity of the transaction, an ID of the transaction, a transmission start time, a transmission end time, an error occurrence time, or an error flag.

12. The chiplet according to claim 10, wherein the save and forward module further comprises a timer, and the transaction time table register records at least one of a transmission start time, a transmission end time, or an error occurrence time of the transaction in the transaction time table using the timer.

13. The chiplet according to claim 10, wherein the save and forward module further comprises a comparator that generates a second error signal associated with a transmission time of the transaction, and in response to determining that the predetermined error time threshold has been exceeded since a transmission start time of the transaction recorded in a time table of the transaction, the comparator generates the second error signal.

14. The chiplet according to claim 13, wherein the save and forward module further comprises an interrupt handler, and the interrupt handler receives the second error signal from the comparator, generates a second interrupt based on the second error signal, and transmits the second interrupt to a host.

15. The chiplet according to claim 3, wherein the slave port transmits to the data buffer whenever the slave port receives a plurality of beats included in the transaction in units of beats, the data buffer sequentially stores the received beats, and before all of the plurality of beats are stored in the data buffer, transmission of at least one beat stored in the buffer is not performed.

16. The chiplet according to claim 1, wherein the chiplet is a receiver side chiplet that receives the transaction from the other chiplet, the slave port receives the transaction from the interconnect module, and the master port transmits the transaction to the bus interface.

17. The chiplet according to claim 16, wherein the bus interface is an Advanced extensible Interface (AXI) type interface.

18. The chiplet according to claim 1, wherein the chiplet is a transmitter side chiplet that transmits the transaction to the other chiplet, the slave port receives the transaction from the bus interface, and the master port transmits the transaction to the interconnect module.

19. The chiplet according to claim 1, wherein a size of the data buffer is determined based on a data size of the transaction.

* * * * *